United States Patent [19]

Abe et al.

[11] 4,254,209

[45] Mar. 3, 1981

[54] DRY PLANOGRAPHIC PLATE WITH LIGHT SENSITIVE SILICONE COMPOSITION

[75] Inventors: Kohki Abe; Hiroyuki Tsuchiya; Masayoshi Mizuno, all of Fuji, Japan

[73] Assignee: Asahi Kasei Kogyo Kabushiki Kaisha, Osaka, Japan

[21] Appl. No.: 30,641

[22] Filed: Apr. 16, 1979

Related U.S. Application Data

[63] Continuation of Ser. No. 841,118, Oct. 11, 1977, abandoned.

[30] Foreign Application Priority Data

Oct. 22, 1976 [JP] Japan ................................ 51-127052

[51] Int. Cl.$^3$ ........................... G03F 7/02; G03C 1/76
[52] U.S. Cl. ................................... 430/272; 101/456; 101/462; 101/465; 101/467; 430/303; 430/502
[58] Field of Search .................... 96/33, 36.3, 86 P; 101/456, 462, 465, 467; 430/303, 272, 502

[56] References Cited

U.S. PATENT DOCUMENTS

| | | | |
|---|---|---|---|
| 3,886,865 | 6/1975 | Ohto et al. ............................ 96/33 X |
| 3,890,149 | 6/1975 | Schlesinger et al. .................... 96/33 |
| 3,894,873 | 7/1975 | Kobayashi et al. ..................... 96/33 |
| 3,905,815 | 9/1975 | Bonham ................................. 96/68 |
| 3,961,947 | 6/1976 | Wells .................................. 96/33 X |
| 4,009,032 | 2/1977 | Schank ................................. 96/33 |
| 4,019,904 | 4/1977 | Noshiro et al. ......................... 96/33 |
| 4,042,613 | 8/1977 | Takamizawa et al. ............ 430/303 X |
| 4,055,424 | 10/1977 | Chu et al. ........................ 430/303 X |
| 4,086,093 | 4/1978 | Ezumi et al. .......................... 96/86 P |
| 4,164,422 | 4/1979 | Okai et al. ............................ 96/67 |

*Primary Examiner*—Edward C. Kimlin
*Attorney, Agent, or Firm*—Armstrong, Nikaido, Marmelstein & Kubovcik

[57] ABSTRACT

Original plates for producing dry planographic printing plates comprising (a) a support, and over and in contact with the support, (b) a light-sensitive adhesive layer made of a photopolymerizable composition comprising one or more photopolymerizable ethylenically unsaturated compounds and one or more photopolymerization initiators and overlying said light-sensitive adhesive layer, (c) a light-sensitive ink-repellent layer made of a silicone composition comprising one or more silicones, one or more photopolymerizable ethylenically unsaturated compounds and one or more photopolymerization initiators. Dry planographic printing plates can be produced from the original plates by image-wise exposing to actinic light and developing.

11 Claims, No Drawings

DRY PLANOGRAPHIC PLATE WITH LIGHT SENSITIVE SILICONE COMPOSITION

This is a continuation of application Ser. No. 841,118, filed Oct. 11, 1977, now abandoned.

This invention relates to original plates (or so-call elements) for producing dry planographic printing plates and a process for producing dry planographic printing plates, which can be used in offset printing without using fountain or dampening solutions.

In planographic printing, there have been used printing plates consisting of water-repellent ink-receptive areas (the image areas) and ink-repellent hydrophilic areas (the non-image areas) and the printing has been done by making the non-image areas reject ink by supplying a dampening water during the printing operation so as to maintain a water layer on the non-image areas, while making only the image areas ink-receptive and transferring the images to copy sheets such as paper. But the printing using a dampening water provided various problems to be solved in that scumming was easily formed by emulsification of the ink and the dampening water, skill was required for controlling the balance between ink and the water, the paper changed its dimension, it took a long time for drying, spoilage was great, and the like.

In order to solve such problems, there has been proposed a so-called dry (water-free) planographic printing plate, i.e. a planographic printing plate which does not require the use of a dampening water and applies an ink-repellent material such as silicone or the like (U.S. Pat. No. 3,677,178). As to processes for producing such a dry planographic printing plate, there have been proposed a process of using a pre-sensitized planographic printing plate (an original plate) comprising an ink-repellent layer made of silicone having a linear structure, a light-sensitive adhesive layer made of light-decomposing light-sensitive material and a base sheet and removing the ink-repellent layer after exposed to light to give image areas (U.S. Pat. No. 3,511,178), a process of using a light curable light-sensitive resin as the light-sensitive adhesive layer and removing the ink-repellent layer not exposed to light to give image areas (U.S. Pat. No. 3,677,178) and the like. But in these processes, since only soluble areas in the adhesive layer are dissolved through the ink-repellent layer of silicone rubber after exposure to light, the thickness of ink-repellent layer is very limited, and the ink-repellent layer irrespective of the image areas and the non-image areas is once swollen during the development. Therefore, there are limitations to the strength of the ink-repellent layer which constitutes the non-image areas during the printing and the resistance to swelling due to ink, and great printing durability cannot be expected. Further there is another defect in that bonding strength between the silicone layer which constitutes the ink-repellent layer and the adhesive layer is insufficient.

On the other hand, there has been proposed a process for making ink-repellent layers in the non-image areas by coating a light-sensitive silicone composition or a mixture of a light-sensitive material and silicone rubber on a base sheet, exposing to light and developing (Japanese Patent Application Kokai (Laid-Open) Nos. 21202/72 and 68803/74). Dry planographic printing plates can very easily be produced by this process, but there are many defects in that even if the silicone composition or the silicone rubber composition covering the image areas is removed very carefully after the development, there remains on the surface of the base sheet a trace of silicone, which prevents the image areas from receiving ink in the printing operation, and it is very difficult to make sufficiently great difference between the light exposed areas and the non-exposed areas in solubility and degree of swelling in various solvents. If the non-exposed areas which correspond to the image areas are made great in solubility and in degree of swelling in various solvents, the exposed areas which correspond to the non-image areas are lowered in resistance to the various solvents and are easily damaged during the development. On the other hand, if the resistance to solvent of the exposed areas is enhanced, the solubility and degree of swelling of the non-exposed areas are lowered, which makes the removing during and after the development difficult and makes it necessary to use a considerably strong solvent or to rub strongly resulting in damage of the non-image areas. Therefore it is very difficult to provide a proper composition which can easily be developed.

The present inventors have studied earnestly the ways to overcome the defects of the known processes and accomplished this invention.

This invention provides an original plate for producing dry planographic printing plates comprising (a) a support, and over and in contact with the support, (b) a light-sensitive adhesive layer made of a photopolymerizable composition comprising one or more photopolymerizable ethylenically unsaturated compounds and one or more photopolymerization initiators, and overlying said light-sensitive adhesive layer, (c) a light-sensitive ink-repellent layer made of a silicone composition comprising one or more silicones, one or more photopolymerizable ethylenically unsaturated compounds and one or more photopolymerization initiators.

When the original plate of this invention is exposed to actinic light, the light exposed areas on the light-sensitive adhesive layer are cured by light and become insoluble in various solvents, and at the same time the light-sensitive ink-repellent layer is also cured by light and the two are strongly bonded. On the other hand, the areas not exposed to the actinic light on the light-sensitive adhesive layer are retained soluble in various solvents and can be removed by dissolving them in a proper solvent. Therefore a dry planographic printing plate can be produced by exposing the original plate to actinic light through a positive film or the like so as to be irradiated corresponding to the images, acting a suitable solvent on the areas not exposed to light on the light-sensitive adhesive layer through the light-sensitive ink-repellent layer, removing the non-exposed adhesive layer and the non-exposed ink-repellent layer together to give the image areas, while retaining the light exposed areas on the support to give the non-image areas.

Since the ink-repellent layer of the original plate contains one or more photopolymerizable ethylenically unsaturated compounds and one or more photopolymerization initiators, it is light-sensitive and can be cured by light when irradiated by actinic light together with the light-sensitive adhesive layer to give strong bonding therewith. By further curing by light, there can be obtained decreases in solubility together with swelling and permeability in various solvents and an increase of film strength comparing with those of before curing, that is, before the exposure to actinic light. Thus the non-exposed areas can easily be removed without damaging the light exposed areas on the ink-repellent layer during the development after the light exposure. The thus obtained printing plate has sufficient strength and sufficient resistance to swelling caused by ink in the ink-repellent layer which constitutes the non-image areas, and shows sufficient printing durability. Further the ink-repellent layer used in this invention shows greater coating film strength than that made of a known silicone composition containing no photopolymerizable ethylenically unsaturated compound. This mechanism is not clearly known, but it seems that mechanical strengths of a coating film made of only silicone is poor due to weak intermolecular cohesive forces of the silicone, whereas coating film strength of the ink-repellent layer used in this invention is enhanced by the photopolymerizable ethylenically unsaturated compounds which have been included in the ink-repellent layer and photopolymerized and cured by irradiation of actinic light.

In addition, since the ink-repellent layer used in this invention is not directly overlain the surface of support or base material but overlain the adhesive layer which covers the support, and the image areas, i.e. the non-exposed areas, are removed together with the adhesive layer during the production of printing plate, no silicone which is an ink-repellent component remains on the image areas even if simply removed by a solvent and sufficient ink receptivity in the printing operation can be obtained.

The silicone composition which makes the light-sensitive ink-repellent layer comprises a major amount of one or more silicones, one or more photopolymerizable ethylenically unsaturated compounds and one or more photopolymerization initiators.

As the silicones, various types or forms of silicones such as oils, rubbers, varnishes (resins) and the like can be used. Among them, those having linear diorgano polysiloxane structure containing the repeat unit of the formula:

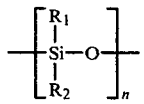

wherein $R_1$ and $R_2$ are independently methyl, phenyl, halophenyl, vinyl, cyanoalkyl having 1–5 carbon atoms in the alkyl group, or haloalkyl having 1–5 carbon atoms; n is as small as 2 or as large as 20,000 or more, are preferable.

The linear diorgano polysiloxane can be used either as it is, e.g. in the state of oil or raw rubber, together with one or more photopolymerizable ethylenically unsaturated compounds and photopolymerization initiators and other additives, or after crosslinked with heating in the presence of a catalyst such as metal carboxylates or the like. As crosslinking methods of the raw rubber, there may be used any methods such as deacetification type, deoximation type, dealcoholization type, deamination type, addition type and the like depending on the kinds of functional groups at a terminal group of siloxane. Further a silicone varnish consisting of siloxane having three dimensional structure can be used.

As mentioned above, various silicones which are available commercially and obtainable easily can be used in this invention.

The photopolymerizable ethylenically unsaturated compounds are compounds having a group of the formula,

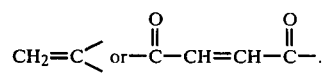

Among the compounds having the group of the formula, $CH_2=C<$, monomers or oligomers having acryloyl or methacryloyl of the formula,

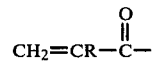

wherein R is hydrogen or methyl, are preferable.

Examples of these compounds are acrylic acid, methacrylic acid; esters of acrylic and methacrylic acids such as methyl, ethyl, n-propyl, isopropyl, t-butyl, n-hexyl, 2-ethylhexyl, n-octyl, n-dodecyl, stearyl, cyclohexyl, tetrahydrofurfuryl, allyl, glycidyl, 2-hydroxyethyl, 2-hydroxypropyl, 3-chloro-2-hydroxy, 4-hydroxybutyl, dimethylaminoethyl, diethylaminoethyl, t-butylaminoethyl, and benzyl acrylates or methacrylates; ethylene glycol, diethylene glycol, propylene glycol, dipropylene glycol, bytylene glycol, polyethylene glycol (HO$\pm$CH$_2$—CH$_2$-O$\pm_n$H, n being 3 or more), and polypropylene glycol

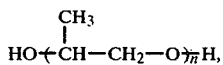

N being 3 or more monoacrylates or diacrylates or monomethacrylates or dimethacrylates; trimethylolpropane triacrylate, trimethylolpropane trimethacrylate, pentaerythritol tri- or tetraacrylate or tri- or tetramethacrylate; amides such as acrylamide, methacrylamide, N-methylolacrylamide, N-methylolmethacrylamide, N-methoxyacrylamide, N-methoxymethacrylamide, N,N'-methylenebisacrylamide, N,N'-methylenebismethacrylamide, N,N'-hexamethylenebisacrylamide, N,N'-hexamethylenebismethacrylamide, diacetone acrylamide, diacetone methacrylamide, and other their derivatives such as having the formulas:

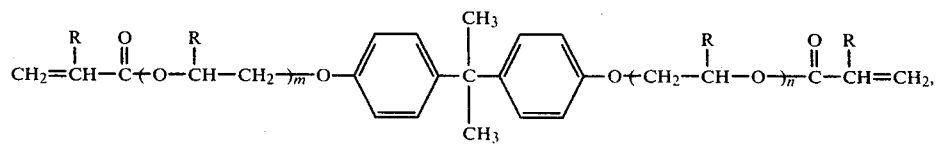

and

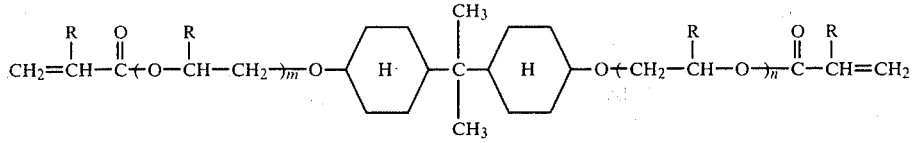

wherein R is H or CH₃; and m and n are 1 or more; unsaturated polyurethane resins modified by monomers having active hydrogen such as hydroxylalkyl acrylate or methacrylate (as disclosed in, e.g., U.S. Pat. No. 3,960,572), and the like.

Preferred examples of the compounds having the group of the formula,

are maleic acid, maleic anhydride, fumaric acid and their esters such as dioctyl fumarate, distearyl fumarate, and the like, unsaturated polyesters, alkyd resins and the like.

Such compounds as styrene, vinyltoluene, divinylbenzene, N-vinylpyridine, N-vinylpyrrolidone, N-vinyl carbazole, diallyl phthalate, triallyl cyanurate, and the like can be used as the photopolymerizable ethylenically unsaturated compounds.

Further such silanes as vinyltrichlorosilane, vinyltriethoxysilane, vinyltris($\beta$-methoxyethoxy)silane, $\gamma$-methacryloxypropyltrimethoxysilane can also preferably be used in this invention.

As the photopolymerization initiators, various known compounds can be used. Examples of these compounds are $\alpha$-carbonyl alcohols or $\alpha$-carbonyl ethers such as benzoin, butyroin, acetoin, $\alpha$-phenylbenzoin, $\alpha$-methylbenzoin, $\alpha$-allylbenzoin, $\alpha$-benzylbenzoin, benzoin methyl ether, benzoin ethyl ether, benzoin propyl ether, benzoin butyl ether, benzoin isopropyl ether, benzoin isobutyl ether, pivaloin ethyl ether, and the like; anthraquinones such as anthraquinone, 2-methylanthraquinone, 2-ethylanthraquinone, 2-tert-butylanthraquinone, 1-chloroanthraquinone, 2-bromoanthraquinone, 2-nitroanthraquinone, anthraquinone-1-aldehyde, anthraquinone-2-thiol, 4-cyclohexylanthraquinone, 1,4-dimethylanthraquinone, 1-methoxyanthraquinone, and the like; ketones such as acetophenone, $\omega$-bromoacetophenone, benzophenone, 4,4'-bis(dimethylamino)benzophenone (Michler's ketone), 4,4'-bis(diethylamino)benzophenone, and the like; diketones such as diacetyl, benzil, and the like; dyestuffs such as eosin, thionine, and the like; 2-naphthalenesulfonyl chloride, diphenyl disulfide, triphenylphosphine, stannous chloride and the like.

The silicone composition which forms the light-sensitive ink-repellent layer contains one or more silicones, one or more photopolymerizable ethylenically unsaturated compounds, and one or more photopolymerization initiators preferably in the proportion of about 20–95% by weight, about 5–80% by weight and about 0.01–10% by weight, more preferably about 40–90% by weight, about 10–60% by weight, and about 0.05–10% by weight, respectively. If the silicone content is less than about 20% by weight, ink repellent is poor and adhesion of ink to the non-image areas takes place during the course of the printing run, whereas more than 95% by weight, that is, the content of photopolymerizable ethylenically unsaturated compound being less than about 5% by weight, sufficient light curability cannot be expected and thus the object of this invention cannot be attained. On the other hand, if the content of photopolymerization initiator is less than about 0.01% by weight, sufficient curing rate cannot be attained, whereas more than about 10% by weight, the curing rate does not increase in proportion to the added amount of the initiator, which is disadvantageous economically.

Needless to say, each component, the silicone, the photopolymerizable ethylenically unsaturated compound and the photopolymerization initiator can be used alone or in combination with two or more.

The silicone composition may preferably include a heat polymerization inhibitor in order to prevent the reaction of photopolymerizable ethylenically unsaturated compounds in the dark or in order to store the composition stably for a long period. Examples of the inhibitors are hydroquinone, hydroquinone monomethyl ether, hydroquinone monoethyl ether, hydroquinone mono-tert-butyl ether, benzoquinone, p-methoxyphenol, 2,5-diphenyl-p-benzophenone, pyridine, phenothiazine, p-diaminobenzene, $\beta$-naphthol, naphthylamine, pyrogallol, tert-butyl catechol, nitrobenzene and the like.

The heat polymerization inhibitor is generally used in an amount of about 0.005–10% by weight based on the total weight of the silicone composition. If the amount of the inhibitor is too small, the effect is insufficient, and if too much, the desired photopolymerization is unfavorably retarded.

The silicone composition may further contain one or more ordinary additives such as fillers, plasticizers, and the like.

Examples of the fillers are inorganic fillers such as glass powder, mica, silica, titanium oxide, and the like, in which fine silica powder being particularly effective; organic fillers such as polyethylene, polyethylene oxide, polyesters, polyamides, polymethacrylates, cellulose, and its derivatives, and the like. The fillers should have good compatibility with the silicone composition. The fillers may be used alone or in combination with two or more members depending on the object of the original plate.

Examples of the plasticizers are dialkyl esters of phthalic acid, oligoethylene glycol monoalkyl ethers, oligoethylene glycol dialkyl ethers, phosphate esters such as tricresyl phosphate, and the like.

The silicone composition may further include one or more siloxanes having photopolymerizable ethylenically unsaturated groups such as vinyl, acryl, methacryl, allyl, and the like as disclosed in Japanese Patent Application Kokai (Laid-Open) No. 21202/72.

The photopolymerizable composition which forms the light-sensitive adhesive layer comprises a major amount of one or more photopolymerizable ethylenically unsaturated compounds and one or more photopolymerization initiators. The same photopolymerizable ethylenically unsaturated compounds and photopolymerization initiators as used in the silicone composition may be used in the photopolymerizable composition. It is preferable to use the photopolymerizable ethylenically unsaturated compound at least in an amount of about 20% by weight, more preferably about 40% by weight based on the weight of the photopolymerizable composition. Since it is desirable that the photopolymerizable composition is solid at least at ordinary temperature and can form a coating film having considerable strength before curing by light, it is preferable to use at least one polymeric compound which is solid at ordinary temperature as the photopolymerizable ethylenically unsaturated compound. Preferable examples of the solid polymeric compounds at ordinary temperature are those having photopolymerizable ethylenically unsaturated groups at side chains obtained by reacting, for example, a high polymer having free carboxyl groups at side chains as disclosed in U.S. Pat. Nos. 3,796,578 and 3,953,408, with an ethylenically unsaturated compound having an oxirane ring such as glycidyl acrylate or methacrylate, more concretely, said polymers are those having a group of the formula:

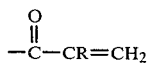

wherein R is hydrogen or methyl, at side chains. The polymeric compounds having free carboxyl groups at side chains can be homopolymers of unsaturated carboxylic acids such as acrylic acid, methacrylic acid, and the like, or copolymer of acrylic acid or methacrylic acid and one or more compounds selected from the group consisting of styrene, acrylonitrile, alkyl acrylates, vinyl acetate, and other photopolymerizable ethylenically unsaturated compounds having only one group of the formula, $CH_2=C<$, mentioned above. The above-mentioned polymers and copolymers having groups of the formula:

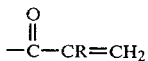

at side chains are preferably used as the adhesive layer in this invention.

The polymeric compounds disclosed in U.S. Pat. No. 3,448,089 can also be used in the photopolymerizable composition.

It is preferable to use the polymeric compound having the group of the formula:

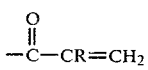

at a side chain in order to exhibit its properties at least in an amount of about 30% by weight to 100% by weight, more preferably about 50 to 90% by weight based on the weight of the photopolymerizable ethylenically unsaturated compound.

The photopolymerization initiator can be used in an amount of about 0.01 to 10% by weight based on the weight of the photopolymerizable composition.

The photopolymerizable composition can preferably contain the same heat polymerization inhibitor as used in the silicone composition.

The photopolymerizable composition may further contain one or more fillers, plasticizers, and the like as mentioned above. Particularly in the case of using only one or more addition polymerizable monomers as the photopolymerizable ethylenically unsaturated compound which constitutes the photopolymerizable composition, it is preferable to use poly(ethylene oxide), polyacrylamide, poly(acrylic acid), poly(vinyl alcohol), poly(vinyl pyrrolidone), polybutadiene, polystyrene, butadienestyrene copolymer, cellulose derivatives and the like as a filler.

As the support used in this invention, there may be used any plates, sheets, and films, since there are required no special properties such as hydrophilic property of the surface of a planographic printing plate which is damped with a dampening solution according to a conventional method. The thickness of sheet or film is usually 0.01–1.0 mm, preferably 0.03–0.5 mm. Preferred examples of the support are metal sheets, e.g. aluminum, zinc, magnesium, copper, steel, stainless steel, etc., plastic sheets or films, e.g. poly(ethylene terephthalate), polycarbonates, polyamides, polypropylene, polyethylene, polystyrene, acetyl cellulose, etc., paper, fabrics and composites thereof. When such composited support is used in a printing plate, good workability can be obtained.

The original plate for producing dry planographic printing plate can be produced by coating a solution or dispersion of the photopolymerizable composition, which has been dissolved or dispersed in a suitable solvent, on the support and drying it to form the light-sensitive adhesive layer, and subsequently coating a solution or dispersion of the silicone composition on the light-sensitive adhesive layer and drying it to form the ink-repellent layer.

The solution or dispersion of the photopolymerizable composition or the silicone composition can be prepared by mixing a solvent with the photopolymerizable composition or the silicone composition in an ordinary mixer using a conventional stirring method. The solvent should be capable of dissolving or dispersing at least silicone, the photopolymerizable ethylenically unsaturated compounds, the photopolymerization initiators, and the heat polymerization inhibitors, and in certain cases fillers and plasticizers. In some cases, it is necessary to use a mixture of two or more solvents depending on the combination of the several ingredients as mentioned above.

Preferred examples of the solvents are aromatic hydrocarbons, aliphatic hydrocarbons, esters, alcohols, and ketones such as toluene, xylene, ethyl acetate, isopropyl alcohol, methyl ethyl ketone, hexane, and a mixture thereof.

The solution or dispersion of the photopolymerizable composition and the silicone composition can be coated in this order on the support by using a conventional coating method, such as sheet fed coating using a rotary coating machine (whirler), a curtain coater, a roll coater or the like, web fed coating using a roll coater or the like. Alternatively, the original plate can also be produced by the so-called transfer method in which the silicone composition layer coated on a carrier film of polypropylene, poly(ethylene terephthalate) or the like is bonded, if required with heating, to the photopolymerizable composition layer coated on the support and then the carrier film is removed from the silicone composition layer.

Thickness of each layer is about $0.1\mu$ to $20\mu$, preferably about $0.5\mu$–$10\mu$. If the thickness of the layers is too great, reproducibility of images is lowered and no clear image can be obtained, whereas if the thickness is less than about 0.1μ, bonding effect and ink repellent effect become unfavorably lowered.

In order to avoid obstruction of the photopolymerization by oxygen, if required, an oxygen impermeable polymer film, for example, a film of poly(ethylene terephthalate), polypropylene, poly(vinyl alcohol), poly(vinyl chloride), poly(vinylidene chloride), polyamide or the like, may be laminated, or an oxygen impermeable layer, for example, a protective layer a major component of which is poly(vinyl alcohol) as disclosed in Japan. Patent Application Kokoku (Post-Exam. Publication) No. 32714/71, may be formed, on the light-sensitive ink-repellent layer.

Prior to applying the light-sensitive adhesive layer to the support, an undercoating layer may be applied to the support or surface treatment such as mat processing, corona discharge treatment, oxidation treatment or the like may be applied to the support in order to strengthen the bonding strength to the adhesive layer and to increase an affinity for ink, i.e. oleophilic property, as the image areas after plate making.

Preferred undercoating layer is that of urethane resin, epoxy resin, acrylate resin, melamine resin, urea resin, Glyptal resin or the like, which is generally used as a coating or adhesive.

Dry planographic printing plates can be produced from the original plate by the same procedures of exposure to light and development as used in producing positive type printing plates used for offset printing. In the light exposure procedure, by irradiating actinic light through a transparent imagewise pattern having positive images such as a positive film, the corresponding images can be obtained on the surface of the original plate.

As the sources of actinic light, there may be used high-pressure mercury lamps, low-pressure mercury lamps, xenone lamps, metal halide lamps, ultraviolet fluorescent lamps, arc lamps, incandescent lamps, the sunlight, lasers, and the like. The actinic light makes the light-sensitive adhesive layer and the ink-repellent layer cure through a positive film or the like. Light with wavelength ranging from 300 to 600 mμ is generally used and light containing wavelength of 300 to 450 mμ in large quantity is particularly preferable. Preferred examples of the light sources are high-pressure mercury lamps, xenone lamps, metal halide lamps and ultraviolet fluorescent lamps. In the case of using lasers, irradiation according to the images of the mask used may be possible, but a scanning method using laser beams is more advantageous.

After the light exposure procedure, the unexposed areas (or portions) on the ink-repellent layer and the adhesive layer are removed in the developing procedure. For example, the exposed original plate is immersed in a solvent as mentioned above to dissolve or swell the unexposed areas on the ink-repellent layer and the adhesive layer, and the desired image can be obtained by rubbing the surface of the plate softly with a fabric, a sponge or the like to remove the unexposed areas.

After removing the unexposed areas, if required, the plate is washed with a fresh solvent or water and dried to produce a printing plate. If necessary, in order to strengthen the exposed areas (or portions), that is, the non-image areas, the plate can be irradiated with actinic light to completely cure the exposed areas. The same light sources as mentioned above can be used in this additional light exposure.

The thus produced printing plate can be used in an offset printing machine and printing can be conducted without using a dampening roller. Thus the various problems caused by using a dampening solution do not occur and excellent planographic offset printing can be conducted smoothly.

This invention is illustrated more particularly by way of the following examples but is not limited to the details thereof.

EXAMPLE 1

In a 500 ml four-necked flask equipped with a stirrer, a reflux condenser, a dropping funnel and a thermometer, 100 g of isopropyl alcohol as a reaction solvent was placed and the air in the flask was replaced by nitrogen. The solvent was heated to 80° C. From the dropping funnel, a mixture of 30 g of acrylonitrile, 30 g of butyl acrylate, 30 g of acrylic acid, 10 g of styrene and 3 g of N,N'-azobisisobutyronitrile as a polymerization catalyst was added to the solvent dropwise for 2.5 hours, then the mixture was heated at 80° C. for 5.5 hours to complete the polymerization and yielded a base polymer. The mixture was cooled to 60° C. and 96 g of isopropyl alcohol, 0.3 g of hydroquinone as a polymerization inhibitor, and 3.75 g of a 40% methanol solution of trimethylbenzyl ammonium hydroxide as a reaction catalyst were added to the mixture. Then the contents were raised to 80° C. and 30 g of glycidyl methacrylate containing 0.3 g of hydroquinone was added dropwise for 1 hour. The reaction was continued for additional 4 hours. After cooling to room temperature, there was obtained light yellow viscous polymer solution. Addition reaction rate of glycidyl methacrylate to the polymer obtained in terms of the carboxyl groups was 68%. Then 250 g of the thus obtained polymer solution (I) was diluted with a mixture of 1300 ml of n-butyl alcohol, 200 ml of benzene and 200 ml of ethyl acetate, and 25 g of pentaerythritol tetramethacrylate as a crosslinking agent, 0.9 g of 2-ethylanthraquinone and 0.1 g of benzoin methyl ether as photopolymerization initiators were added to the mixture with sufficient stirring to give a photopolymerizable composition solution.

The solution of photopolymerizable composition was coated on an aluminum plate of 0.3 mm thick, which had been washed with water and dried, using a whirler and dried to form a light-sensitive adhesive layer of about 3μ thick on the aluminum plate.

A solution of silicone composition was prepared by mixing the following ingredients with sufficient stirring:
(a) A toluene solution (solid content 50% by weight) of one-pack type RTV (Room Temperature Vulcanizing) silicone rubber (deacetification type, Shinetsu Silicone, KE-42-TS-RTV) . . . 100 g
(b) Pentaerythritol tetramethacrylate . . . 50 g
(c) Michler's ketone . . . 3 g
(d) Toluene . . . 150 g The solution of silicone composition thus prepared was coated on the adhesive layer with a whirler and dried to give an ink-repellent layer of 4μ thick, total thickness of the two layers being 7μ. After curing the silicone rubber at room temperature for 24 hours, the thus obtained original plate was covered with a positive film using a vacuum printer frame and exposed to light, i.e. a 2 kw ultrahigh-pressure mercury lamp was used for 1.5 minutes at a distance of 1 meter.

On the other hand, a developing solution was prepared by mixing 200 ml of n-butyl acetate, 400 ml of water and 1000 ml of isopropyl alcohol. The exposed plate was immersed in the developing solution for 30 seconds' developing time and the surface of the plate was softly rubbed with a sponge to give clear images. The thus obtained planographic printing plate was placed on an offset printing machine while taking off a dampening roller and 5,000 sheets of paper were printed using black ink (F Gloss No. 85, Dainippon Ink and Chemicals, Inc.). As a result, there was no attachment of ink to the non-image areas, i.e. no dirt on the non-image areas, and there was no change in the fine pattern on the image areas comparing with the state at the beginning of printing. The printing plate was able to be continuously used for further printing.

EXAMPLE 2

Using the same procedure as described in Example 1 except for using the following monomer mixture, the preparation of a base polymer and the addition reaction of glycidyl methacrylate were carried out:
Acrylonitrile: 30 g
Butyl acrylate: 30 g
Acrylic acid: 30 g
Vinyl acetate: 10 g
Addition reaction rate of glycigyl methacrylate to the polymer obtained in terms of the carboxyl group was 70%. To 250 g of the thus obtained polymer solution (II), 25 g of trimethylolpropane triacrylate as a cross-linking agent and 1 g of Michler's ketone as a photopolymerization initiator and a solvent mixture as described in Example 1 were added to give a solution of photopolymerizable composition.

An original plate having the light-sensitive adhesive layer of 3μ thick and the ink-repellent layer of 4μ thick was produced by using the same manner as described in Example 1 except for using the photopolymerizable composition solution mentioned above. After the light exposure and development as described in Example 1, no peeling nor swelling was recognized and clear images were obtained. After printing 5,000 sheets of paper in the same manner as described in Example 1, there was no dirt on the non-image areas and no broken image in the fine pattern on the image areas. The printing plate was able to be continuously used for further printing.

EXAMPLE 3

Using the following monomer mixture, a base polymer was prepared in the same manner as described in Example 1:
Acrylonitrile: 30 g
Styrene: 10 g
Butyl acrylate: 30 g
Acrylic acid: 30 g
After completing the polymerization, 27 g of glycidyl acrylate was used in place of 30 g of glycidyl methacrylate and addition reaction of glycidyl acrylate to the base polymer was carried out in the same manner as described in Example 1. Addition reaction rate of glycidyl acrylate to the polymer obtained in terms of the carboxyl group was 62%. To 250 g of the thus obtained polymer solution (III), 25 g of tetraethylene glycol dimethacrylate as a crosslinking agent and 1 g of benzophenone as a photopolymerization initiator and a solvent mixture as described in Example 1 were added to give a solution of photopolymerizable composition.

A solution of silicone composition was prepared by mixing the following ingredients with sufficient stirring:
(a) A solution of condensation cure type silicone rubber (dehydrogenation type, Toray Silicone, Syloff 23) (solvent, xylene; solid content, 27% by weight) ... 100 g
(b) A curing catalyst for silicone rubbers (Toray Silicon, SH-23K) ... 4 g
(c) Pentaerythritol tetramethacrylate ... 15 g
(d) Michler's ketone ... 0.08 g
(e) Toluene ... 400 g The solutions of photopolymerizable composition and silicone composition thus obtained were coated on the support in the same manner as described in Example 1 and dried and cured at 100° C. for 1 hour. Then the original plate was exposed to light and developed as described in Example 1 to give a printing plate having clear images.

The result of printing was the same as described in Example 1 and there was no dirt on the non-image areas and no broken image on the image areas. The printing plate was able to be continuously used for further printing.

COMPARATIVE EXAMPLE 1

Using the same procedure as described in Example 1 except for using the following silicone composition solution A or B, original plates were produced:
Silicone composition solution A
(a) A toluene solution (solid content, 50% by weight) of one-pack type RTV silicone rubber (deacetification type, Shinetsu Silicone, KE-42-TS-RTV) ... 100 g
(b) Toluene ... 150 g
Silicone composition solution B
(a) A toluene solution (solid content, 50% by weight) of one-pack type RTV silicone rubber (deacetification type, Shinetsu Silicone, KE-42-TS-RTV) ... 100 g
(b) Michler's ketone ... 3 g
(c) Toluene ... 150 g The thus obtained original plates were exposed to light and developed as described in Example 1, but no clear image was obtained due to peeling of some of the non-image areas during the development. Particularly, the original plate produced by using the silicone composition solution A showed this tendency remarkably.

When a printing plate thus produced by using solution B was used for printing as described in Example 1, there arose attachment of ink to the remaining non-image areas not peeled during the printing plate making after printing about 500 sheets of paper and also arose scumming. When the ink was wiped out from the printing plate, countless cracks were found on the surface. Thus it was estimated that the adhesion of ink was caused by damage of the silicone layer.

COMPARATIVE EXAMPLE 2

An aluminum plate of 0.3 mm thick having been well washed with water and dried was coated with the same silicone composition solution as used in Example 1 using a whirler and dried to form an ink-repellent layer of about 4μ thick thereover. After curing the silicone rubber at room temperature for 24 hours, the thus obtained plate was covered with a positive film using a vacuum printer frame and exposed to light, i.e. a 2 kw high-pressure mercury lamp was used for 1.5 minutes at a distance of 1 meter.

The exposed plate was immersed in the same developing solution as used in Example 1 and the surface of the plate was rubbed with a sponge softly while developing. But no clear image was obtained since removal of the ink-repellent layer on the image areas and bonding strength of the ink-repellent layer on the non-image areas to the aluminum plate were inferior to those of Example 1.

When the thus produced printing plate was used for printing as described in Example 1, attachment of ink to the image areas was bad and partly unprinted portions appeared.

EXAMPLE 4

The photopolymerizable composition solution obtained in Example 2 was coated on a poly(ethylene terephthalate) film of 100μ thick having been subjected to corona discharge treatment using a whirler and dried to form a light-sensitive adhesive layer of about 3μ thick.

A solution of silicone composition as mentioned below was coated on the light-sensitive adhesive layer to form an ink-repellent layer of about 5μ thick.

Silicone composition solution
(a) An addition type silicone rubber solution (a mixed solvent of xylene and heptane, solid content 28% by weight) (Toray Silicone, SRX 244) . . . 100 g
(b) A curing catalyst (Toray Silicon, SRX 242AC) . . . 5 g
(c) A curing accelerator (Toray Silicon, BX 14-180) . . . 1 g
(d) Glacial acetic acid . . . 16 g
(e) Unsaturated polyester* . . . 14.2 g
(f) 2-Hydroxyethyl methacrylate . . . 2.8 g
(g) Diacetone acrylamide . . . 2.8 g
(h) Benzoin . . . 0.15 g
(i) Hydroquinone . . . 0.1 g
(j) Ethyl acetate . . . 37 g
(k) Toluene . . . 418 g (Note) Unsaturated polyester* is a polyester obtained by condensing propylene glycol, ethylene glycol, fumaric acid and adipic acid in a molar ratio of 0.30:0.20:0.25:0.25 and having an acid value of 25.

The thus produced original plate was exposed to light and developed as described in Example 1 to give clear images, while the unexposed areas (the image areas) were removed excellently. Result of printing 2,000 sheets of paper was also excellent.

EXAMPLE 5

The photopolymerizable composition solution obtained in Example 1 was coated on a baryta paper in the same manner as described in Example 1 and dried to form a light-sensitive adhesive layer of 3μ thick.

On the other hand, an unsaturated polymer, which is one ingredient of the silicone composition, was prepared as follows. To 200 g of polyethylene adipate (diol, molecular weight 2,000), 34,8 g of tolyenediisocyanate and 0.5 g of dibutyl tin laurate were added and the reaction was carried out at 70° C. for 2 hours to give polyethylene adipate having isocyanate groups at the both ends. To this, 100 g of ethylene oxide-propylene oxide copolymer (the ethylene oxide content 35% by weight; block copolymerized diol; molecular weight, 2,000) was added and the reaction was carried out at 70° C. for 2.5 hours to give a block copolymer having isocyanate groups at the both ends (molecular weight, about 6,600). To 300 g of the resulting block copolymer, 25 g of 2-hydroxyethyl methacrylate and 0.1 g of hydroquinone were added and the reaction was carried out at 70° C. for 2 hours to give the unsaturated polymer. Using this unsaturated polymer, a solution of silicone composition as mentioned below was prepared.

Silicone composition solution
(a) A toluene solution (solid content, 50% by weight) of one-pack type RTV silicone rubber (deoximation type, Shinetsu Silicone, KE-45-TS-RTV) . . . 100 g
(b) Unsaturated polymer . . . 21.1 g
(c) 2-Hydroxyethyl methacrylate . . . 5.3 g
(d) 2-Ethylhexyl acrylate . . . 1.1 g
(e) n-Butyl acrylate . . . 2.1 g
(f) Benzoin ethyl ether . . . 0.4 g
(g) Toluene . . . 150 g The solution of silicone composition was coated on the light-sensitive adhesive layer using a whirler and dried to form an ink-repellent layer of 5μ thick.

The thus produced original plate was exposed to light and developed as described in Example 1 to give clear images. After printing 1000 sheets of paper as described in Example 1, there were no scumming nor broken image in the fine pattern on the image areas and the printing plate was able to be continuously used for further printing.

EXAMPLE 6

The procedure of Example 3 was repeated except for using a copper plate of 0.1 mm thick lined with a steel plate of 0.2 mm thick in place of the aluminum plate and a solution of silicone composition as mentioned below:

Silicone composition solution
(a) A toluene solution (solid content, 30% by weight of addition type silicone rubber (addition type, Toray Silicone, SRX-211) . . . 100 g
(b) A curing catalyst (Toray Silicone, SRX 212) . . . 0.6 g
(c) 2-Hydroxyethyl methacrylate . . . 8.5 g
(d) Toluene . . . 500 g
(e) Benzoin butyl ether . . . 0.04 g The same excellent results as obtained in Example 3 were obtained.

EXAMPLE 7

The procedure of Example 1 was repeated except for using an aluminum plate of 0.15 mm thick as a support and a solution of silicone composition as mentioned below:

Silicone composition solution
(a) A toluene solution (solid content, 50% by weight) of one-pack type RTV silicone rubber (Shinetsu Silicone, KE-42-TS-RTV) . . . 100 g
(b) Trimethylolpropane triacrylate . . . 40 g
(c) Michler's ketone . . . 3 g
(d) Toluene . . . 150 g The same excellent printing effect as obtained in Example 1 was obtained.

EXAMPLE 8

The procedure of Example 1 was repeated except for using the solution of photopolymerizable composition obtained in Example 2 and a solution of silicone composition as mentioned below:

Silicone composition solution
(a) A toluene solution (solid content, 50% by weight) of one-pack type RTV silicone rubber (Shinetsu Silicone, KE-42-TS-RTV) . . . 100 g
(b) Diacetone acrylamide . . . 5 g
(c) Benzoin isobutyl ether . . . 0.1 g
(d) Silicone varnish (Shinetsu Silicone, KR-218) . . . 10 g (e) Toluene ... 150 g The same excellent results as obtained in Example 1 were obtained.

EXAMPLE 9

The procedure of Example 1 was repeated except for using solutions of photopolymerizable composition and silicone composition as mentioned below:

Photopolymerizable composition solution
(i) Polymer solution (III) obtained in Example 3 ... 250 g
(ii) Tetraethylene glycol dimethacrylate ... 25 g
(iii) ε-Methacryloxypropyl trimethoxysilane ... 12 g
(iv) Benzophenone ... 1 g Silicone composition solution
(a) A toluene solution (solid content, 50% by weight) of one-pack type RTV silicone rubber (Shinetsu Silicone, KE-42-TS-RTV) ... 100 g
(b) Diethylene glycol dimethacrylate ... 30 g
(c) Michler's ketone ... 3 g
(d) Toluene ... 150 g The same excellent results as obtained in Example 1 were obtained.

EXAMPLE 10

The procedure of Example 1 was repeated except for using the following solution of silicone composition.

Silicone composition solution
(a) Dimethyl silicone rubber (raw rubber) (TSE 200, manufactured by Toshiba Silicone Co.) ... 15 g
(b) Pentaerythritol tetramethacrylate ... 2 g
(c) 2-Ethylanthraquinone ... 0.3 g
(d) Toluene ... 300 g The same excellent results as obtained in Example 1 were obtained.

What is claimed is:

1. An original plate for producing dry planographic printing plates comprising:
   (a) a support, and over and in contact with the support,
   (b) a light-sensitive adhesive layer made of a photopolymerizable composition comprising one or more photopolymerizable ethylenically unsaturated compounds and one or more photopolymerization initiators, at least 30% by weight of said one or more polymerizable ethylenically unsaturated compounds being one or more photopolymerizable ethylenically unsaturated polymeric compounds having a group of the formula:

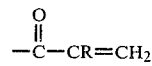

wherein R is hydrogen or methyl, at a side chain, and being obtained by reacting a polymeric compound having free carboxyl groups at side chains with glycidyl methacrylate and/or glycidyl acrylate; and overlying said light-sensitive adhesive layer,
   (c) a light-sensitive ink-repellent layer made of a silicone composition consisting essentially of about 20 to 95% by weight of one or more silicones, about 5 to 80% by weight of one or more photopolymerizable ethylenically unsaturated compounds and about 0.01 to 10% by weight of one or more photopolymerization initiators; and wherein non-exposed portions of both the light-sensitive adhesive layer and the light-sensitive ink-repellent layer are removable by a solvent after image-wise exposure to actinic light.

2. An original plate according to claim 1, wherein the photopolymerizable ethylenically unsaturated compound included in the photopolymerizable composition or the silicone composition has a group of the formula:

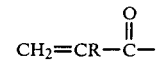

wherein R is hydrogen or methyl, or a group of the formula:

3. An original plate according to claim 2, wherein the photopolymerizable ethylenically unsaturated compound included in the silicone composition is pentaerythritol tetramethacrylate, 2-hydroxyethyl methacrylate, or trimethylolpropane triacrylate.

4. An original plate according to claim 1, wherein the silicone has linear diorgano polysiloxane structure represented by the formula:

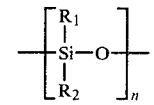

wherein $R_1$ and $R_2$ are independently methyl, phenyl, halophenyl, vinyl, cyanoalkyl, or haloalkyl; and n is 2 or more.

5. An original plate according to claim 1, wherein the polymeric compound having free carboxyl groups at side chains is a polymer of ethylenically unsaturated compound including unsaturated carboxylic acids.

6. An original plate according to claim 5, wherein the polymeric compound having free carboxyl groups at side chains is a homopolymer of acrylic acid or methacrylic acid or a copolymer of acrylic acid or methacrylic acid and one or more compounds selected from the group consisting of styrene, acrylonitrile, an alkyl acrylate and vinyl acetate.

7. An original plate according to claim 1, wherein the thickness of the support is 0.01 to 1.0 mm, and the thicknesses of the adhesive layer and the ink-repellent layer are each 0.1 to 20μ.

8. An original plate according to claim 1, wherein the support is an aluminum plate.

9. An original plate according to claim 1, wherein the support is poly(ethylene terephthalate) film.

10. A process for producing a dry planographic printing plate which comprises subjecting an original plate for producing dry planographic printing plate comprising (a) a support, and over and in contact with the support, (b) a light-sensitive adhesive layer as defined in claim 1, and overlying said light-sensitive adhesive layer, (c) a light-sensitive ink-repellent layer as defined in claim 1 to image-wise exposure to actinic light, curing the exposed portions on the light-sensitive adhesive layer by light, and removing the unexposed portions on the light-sensitive adhesive layer and the light-sensitive ink-repellent layer to give the non-image areas on the exposed portions and the image areas on the unexposed portions.

11. A process for producing a dry planographic printing plate which comprises irradiating an original plate for producing planographic printing plate through a positive film with actinic light, said original plate comprising (a) a support, and over and in contact with the support, (b) a light-sensitive adhesive layer, and overlying said light-sensitive adhesive layer as defined in claim 1, (c) a light-sensitive ink-repellent layer as defined in claim 1, immersing the exposed original plate in a developing solvent and removing the unexposed areas from the ink-repellent layer and the adhesive layer after dissolving or swelling.

* * * * *